United States Patent
Wang

(10) Patent No.: US 10,777,158 B2
(45) Date of Patent: Sep. 15, 2020

(54) SHIFT REGISTER CIRCUIT AND DISPLAY PANEL USING THE SAME

(71) Applicants: HKC Corporation Limited, Shenzhen, Guangdong (CN); Chongqing HKC Optoelectronics Technology Co., Limited, Chongqing (CN)

(72) Inventor: Mingliang Wang, Chongqing (CN)

(73) Assignees: HKC Corporation Limited, Shenzhen, Guangdong (CN); Chongqing Optoelectronics Technology Co., Ltd., Chongqing (CN)

( * ) Notice: Subject to any disclaimer, the term of this patent is extended or adjusted under 35 U.S.C. 154(b) by 368 days.

(21) Appl. No.: 15/556,043

(22) PCT Filed: Jul. 7, 2017

(86) PCT No.: PCT/CN2017/092142
§ 371 (c)(1),
(2) Date: Sep. 6, 2017

(87) PCT Pub. No.: WO2018/218732
PCT Pub. Date: Dec. 6, 2018

(65) Prior Publication Data
US 2020/0020289 A1     Jan. 16, 2020

(30) Foreign Application Priority Data
May 27, 2017 (CN) .......................... 2017 1 0390483

(51) Int. Cl.
*G09G 3/36* (2006.01)
*G11C 19/28* (2006.01)

(52) U.S. Cl.
CPC ........... *G09G 3/3677* (2013.01); *G11C 19/28* (2013.01); *G09G 2310/0286* (2013.01)

(58) Field of Classification Search
CPC ... G09G 2300/0408; G09G 2310/0267; G09G 2310/0286; G09G 2310/0289;
(Continued)

(56) References Cited

U.S. PATENT DOCUMENTS

2013/0328612 A1    12/2013   Ofuji et al.
2014/0079173 A1*    3/2014   Yan .................... G11C 19/28
                                                                         377/64

FOREIGN PATENT DOCUMENTS

CN      101136185 A     3/2008
CN      103050106 A     4/2013
(Continued)

*Primary Examiner* — Insa Sadio
(74) *Attorney, Agent, or Firm* — Juan Carlos A. Marquez; Marquez IP Law Office, PLLC

(57) ABSTRACT

A shift register circuit includes a plurality of stages of shift registers, where each includes: a first switch, where a control end of the first switch is electrically coupled to a first node, a first end of the first switch is electrically coupled to a first frequency signal, and a second end of the first switch is electrically coupled to a current-stage gate signal; a second switch, where a control end of the second switch is electrically coupled to the first node, a first end of the second switch is electrically coupled to a second frequency signal, and a second end of the second switch is electrically coupled to a next-stage frame signal; and a third switch, where a control end of the third switch is electrically coupled to a current-stage frame signal, and a second end of the third switch is electrically coupled to the first node.

10 Claims, 8 Drawing Sheets

(58) Field of Classification Search
CPC ........... G09G 2310/06; G09G 2310/08; G09G 2320/0214; G09G 2330/021; G09G 3/20; G09G 3/3677; G11C 19/28
See application file for complete search history.

(56) References Cited

FOREIGN PATENT DOCUMENTS

| | | |
|---|---|---|
| CN | 103366822 A | 10/2013 |
| CN | 106157923 A | 11/2016 |

\* cited by examiner

SHIFT REGISTER CIRCUIT AND DISPLAY PANEL USING THE SAME

BACKGROUND

Technical Field

This application relates to a field of display technologies, and in particular, to a shift register circuit and a display panel using the same.

Related Art

In recent years, with progress of science and technologies, flat displays gradually become popular and have advantages such as lightness and slimness. Currently, a driver circuit of a flat display is mainly formed by connecting an external IC to a panel. However, this method cannot lower product costs or make the panel slimmer.

In addition, a display device usually includes a gate driver circuit, a source driver circuit, and a pixel array. The pixel array includes a plurality of pixel circuits. Each pixel circuit is switched on or off according to a scanning signal provided by the gate driver circuit. A data screen is displayed according to a data signal provided by the source driver circuit. With regard to the gate driver circuit, the gate driver circuit usually includes a plurality of stages of shift registers and outputs the scanning signal to the pixel array by transferring the scanning signal from a current-stage shift register to a next-stage shift register, so as to sequentially switch on the pixel circuits and enable the pixel circuits to receive the data signal.

Therefore, in a manufacturing process of a driver circuit, a gate driver circuit is directly manufactured on an array substrate to replace a driver chip made by connecting an external IC. Such a technology, referred to as Gate On Array (GOA), may be directly applied to a periphery of a panel, to reduce manufacturing procedures, product costs, and a thickness of the panel.

In the GOA technology, an original gate integrated circuit (Gate IC) is divided into a level shifter integrated circuit (level shifter IC) and a shift register. The level shifter IC is manufactured on a driver board and the shift register is manufactured on a panel. In this way, the gate IC is not required, and a length of a bezel can be further reduced.

However, an active switch, connected to a frequency signal, of a shift register is likely to be switched on because a low potential of the frequency signal is lower than a low default potential VSS when the frequency signal is switched to the low potential. In addition, for charging a panel, within the time of a frame, a row is only switched on once and is off in most of the remaining time. Consequently, once an active switch is switched on, high power consumption is caused, especially for a panel with a large size and high resolution.

SUMMARY

To resolve the foregoing technical problem, an objective of this application is to provide a shift register circuit. When a frequency signal is switched to a low potential, an active switch connected to the frequency signal can no longer generate a cross-voltage difference, thereby preventing the active switch from generating extra power consumption because of an electric leakage, being switched on, or the like.

The objective of this application is achieved and the technical problem of this application is resolved by using the following technical solutions. A shift register circuit is provided according to this application, comprising a plurality of stages of shift registers, where each shift register comprises: a first switch, where a control end of the first switch is electrically coupled to a first node, a first end of the first switch is electrically coupled to a first frequency signal, and a second end of the first switch is electrically coupled to a current-stage gate signal; a second switch, where a control end of the second switch is electrically coupled to the first node, a first end of the second switch is electrically coupled to a second frequency signal, and a second end of the second switch is electrically coupled to a next-stage frame signal; and a third switch, where a control end of the third switch is electrically coupled to a current-stage frame signal, and a second end of the third switch is electrically coupled to the first node.

In an embodiment of this application, the shift register circuit further comprises a fourth switch, where a control end of the fourth switch is electrically coupled to a second node, a first end of the fourth switch is electrically coupled to the current-stage gate signal, and a second end of the fourth switch is electrically coupled to a preset low potential, where the second node is electrically coupled to a next-stage gate signal.

In an embodiment of this application, the shift register circuit further comprises a fifth switch, where a control end of the fifth switch is electrically coupled to a second node, a first end of the fifth switch is electrically coupled to the first node, and a second end of the fifth switch is electrically coupled to a preset low potential, where the second node is electrically coupled to a next-stage gate signal.

In an embodiment of this application, the shift register circuit further comprises a pull-down sub-circuit, electrically coupled to the first node, the current-stage gate signal, and a low default potential.

In an embodiment of this application, the shift register circuit further comprises a pull-down sub-circuit controller, electrically coupled to the low default potential and the pull-down sub-circuit.

In an embodiment of this application, a first end of the third switch is electrically coupled to a preceding-stage gate signal.

In an embodiment of this application, a first end of the third switch is electrically coupled to the current-stage frame signal.

In an embodiment of this application, a first end of the third switch is electrically coupled to a direct-current signal, to provide electric power for pre-charging the shift register circuit.

Another objective of this application is to provide a display panel, comprising: a first substrate and a second substrate disposed opposite to each other; a first polarizer, disposed on an outer surface of the first substrate; a second polarizer, disposed on an outer surface of the second substrate, where a polarization direction of the first polarizer is parallel to a polarization direction of the second polarizer; and a shift register circuit, comprising a plurality of stages of shift registers, where each shift register comprises: a first switch, where a control end of the first switch is electrically coupled to a first node, a first end of the first switch is electrically coupled to a first frequency signal, and a second end of the first switch is electrically coupled to a current-stage gate signal, a second switch, where a control end of the second switch is electrically coupled to the first node, a first end of the second switch is electrically coupled to a second frequency signal, and a second end of the second switch is electrically coupled to a next-stage frame signal; and a third switch, where a control end of the third switch is electrically coupled to a current-stage frame signal, and a second end of the third switch is electrically coupled to the first node.

In an embodiment of this application, the display panel further comprises a fourth switch, where a control end of the fourth switch is electrically coupled to a second node, a first end of the fourth switch is electrically coupled to the current-stage gate signal, and a second end of the fourth switch is electrically coupled to a preset low potential, where the second node is electrically coupled to a next-stage gate signal.

In an embodiment of this application, the display panel further comprises a fifth switch, where a control end of the fifth switch is electrically coupled to a second node, a first end of the fifth switch is electrically coupled to the first node, and a second end of the fifth switch is electrically coupled to a preset low potential, where the second node is electrically coupled to a next-stage gate signal.

In an embodiment of this application, the display panel further comprises a pull-down sub-circuit, electrically coupled to the first node, the current-stage gate signal, and a low default potential.

In an embodiment of this application, the display panel further comprises a pull-down sub-circuit controller, electrically coupled to the low default potential and the pull-down sub-circuit.

In an embodiment of this application, a first end of the third switch is electrically coupled to a preceding-stage gate signal.

In an embodiment of this application, a first end of the third switch is electrically coupled to the current-stage frame signal.

In an embodiment of this application, a first end of the third switch is electrically coupled to a direct-current signal.

In an embodiment of this application, the direct-current signal is used for pulling up a potential of the control end of the third switch.

The technical problem of this application may be further resolved by taking the following technical measures. A shift register circuit is provided according to this application, comprising a plurality of stages of shift registers, where each shift register comprises: a first switch, where a control end of the first switch is electrically coupled to a first node, a first end of the first switch is electrically coupled to a first frequency signal, and a second end of the first switch is electrically coupled to a current-stage gate signal; a second switch, where a control end of the second switch is electrically coupled to the first node, a first end of the second switch is electrically coupled to a second frequency signal, and a second end of the second switch is electrically coupled to a next-stage frame signal; a third switch, where a control end of the third switch is electrically coupled to a current-stage frame signal, and a second end of the third switch is electrically coupled to the first node; a fourth switch, where a control end of the fourth switch is electrically coupled to a second node, a first end of the fourth switch is electrically coupled to the current-stage gate signal, and a second end of the fourth switch is electrically coupled to a preset low potential, where the second node is electrically coupled to a next-stage gate signal; a fifth switch, where a control end of the fifth switch is electrically coupled to the second node, a first end of the fifth switch is electrically coupled to the first node, and a second end of the fifth switch is electrically coupled to the preset low potential; and a pull-down sub-circuit, electrically coupled to the first node, the current-stage gate signal, and a low default potential, where a first end of the third switch is electrically coupled to a preceding-stage gate signal, the current-stage frame signal, or a direct-current signal.

In this application, original process requirements and product costs may be maintained without greatly changing an existing production procedure. When a frequency signal is switched to a low potential, an active switch connected to the frequency signal can no longer generate a cross-voltage difference, thereby preventing the active switch from generating extra power consumption because of an electric leakage, being switched on, or the like. The improvement can be easily implemented and also helps improve circuit reliability. This application is applicable to manufacturing of panels with various sizes and has relatively high applicability.

DETAILED DESCRIPTION

The following embodiments are described with reference to the accompanying drawings, used to exemplify specific embodiments for implementation of this application. Terms about directions mentioned in this application, such as "on", "below", "front", "back", "left", "right", "in", "out", and "side surface" merely refer to directions in the accompanying drawings. Therefore, the used terms about directions are used to describe and understand this application, and are not intended to limit this application.

The accompanying drawings and the description are considered to be essentially exemplary, rather than limitative. In the figures, modules with similar structures are represented by using the same reference number. In addition, for understanding and ease of description, the size and the thickness of each component shown in the accompanying drawings are arbitrarily shown, but this application is not limited thereto.

In the accompanying drawings, for clarity, thicknesses of a layer, a film, a panel, an area, and the like are enlarged. In the accompanying drawings, for understanding and ease of description, thicknesses of some layers and areas are enlarged. It should be understood that when a component such as a layer, a film, an area, or a base is described to be "on" "another component", the component may be directly on the another component, or there may be an intermediate component.

In addition, throughout this specification, unless otherwise explicitly described to have an opposite meaning, the word "include" is understood as including the component, but not excluding any other component. In addition, throughout this specification, "on" means that one is located above or below a target component and does not necessarily mean that one is located on the top based on a gravity direction.

To further describe the technical measures taken in this application to achieve the intended objectives and effects thereof, specific implementations, structures, features, and effects of a shift register circuit and a display panel using same provided according to this application are described below in detail with reference to the drawings and preferred embodiments.

A display panel in this application is, for example, a liquid crystal display panel, an OLED display panel, a QLED display panel, or another display panel. Using the liquid crystal display panel as an example, the liquid crystal display panel may include: an active array (thin film transistor (TFT)) substrate, a color filter (CF) substrate, and a liquid crystal layer formed between the two substrates.

In some embodiments, the display panel in this application may be a curved-surface display panel.

In some embodiments, the active array (TFT) and the CF in this application may be formed on a same substrate.

Figure 1A:
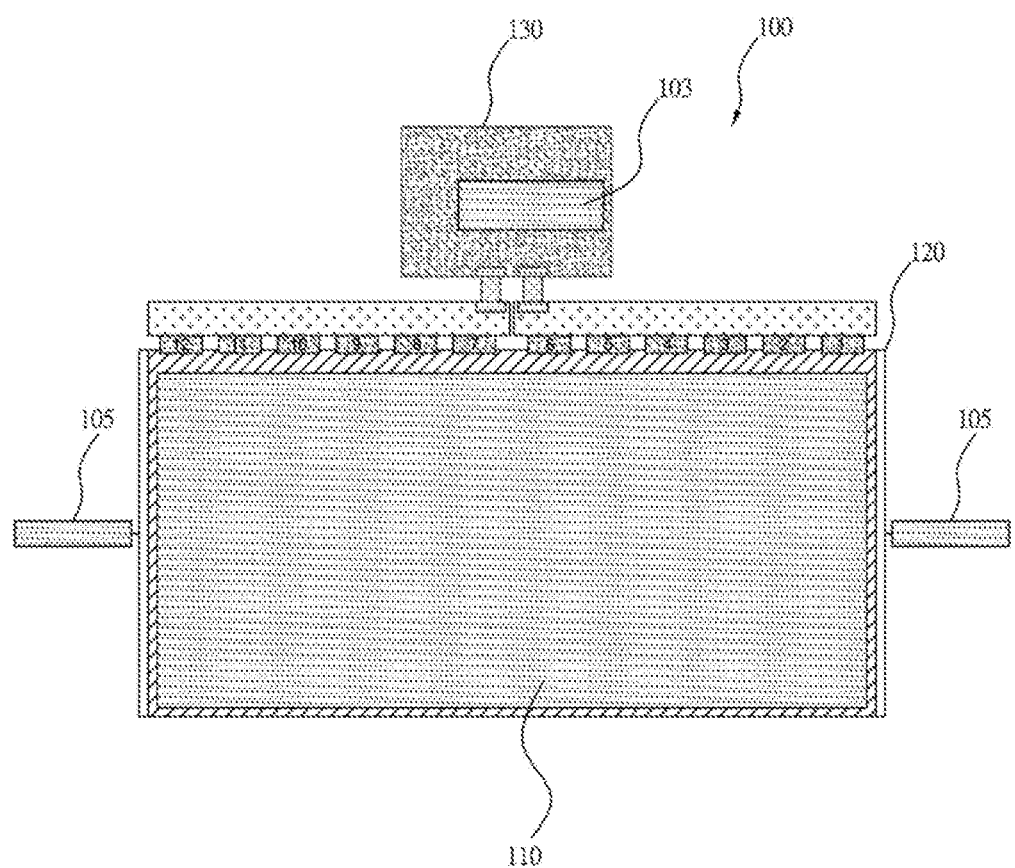
FIG. 1a is a schematic diagram of an exemplary liquid crystal display.

FIG. 1a is a schematic diagram of an exemplary liquid crystal display. Referring to FIG. 1a, a GOA liquid crystal display 100 includes a CF substrate 110 and an active array substrate 120. A gate IC is divided into two parts: a level shifter module 103 and a shift register 105. The level shifter module 103 is disposed on a driver circuit board 130 and the shift register 105 is disposed on the active array substrate 120. Because the shift register 105 occupies a very small area, an ultra-narrow bezel of a GOA panel is usually achieved.

Figure 1B:
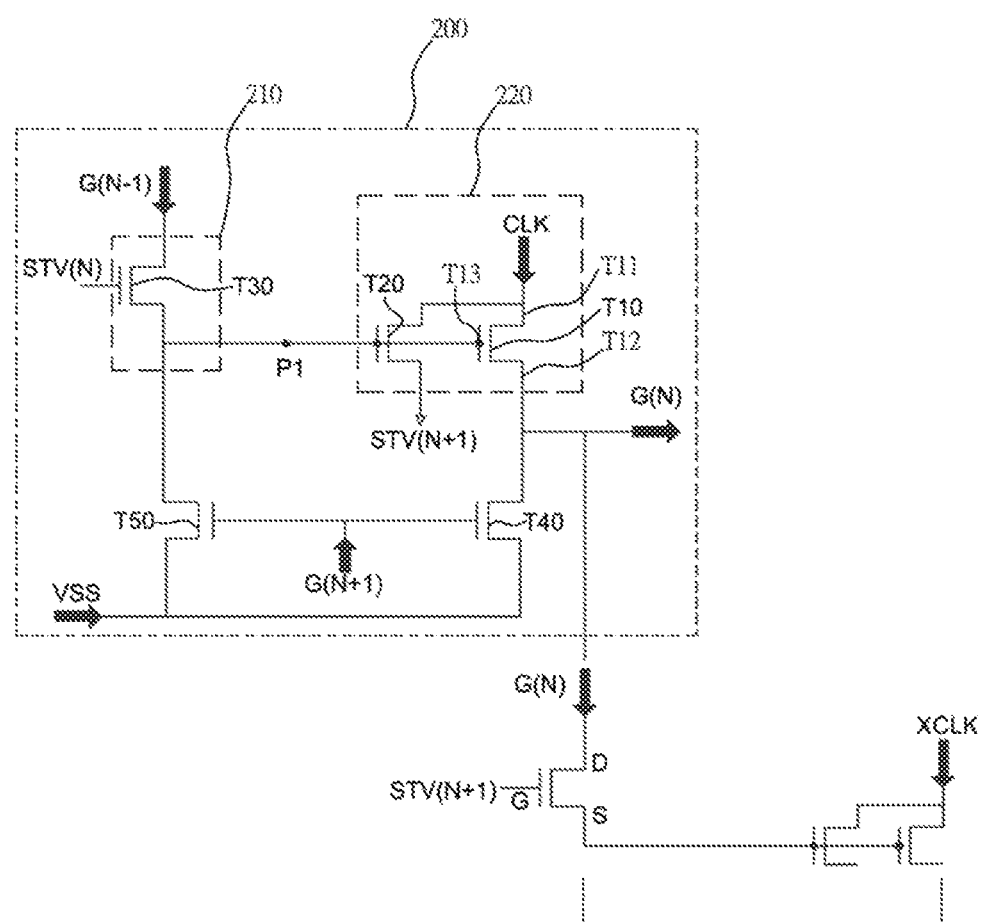
FIG. 1b is a schematic diagram of an exemplary shift register circuit.

FIG. 1b is a schematic diagram of an exemplary shift register circuit usually being obtained by improving a Thompson circuit. Referring to FIG. 1b, a shift register circuit 200 includes an input pulse signal circuit 210 and a frequency signal circuit 220. A frequency signal CLK is output by a level shifter module 103, a gate signal G(N) is provided by a gate line in a display panel, a low default potential VSS is a low level and the gate line is switched off at the low level, and a frame signal STV(N) is a start signal.

After a current-stage frame signal STV(N) is started, a third switch T30 is switched on, a preceding-stage gate signal G(N−1) charges a first node P1, and a first switch T10 and a second switch T20 are switched on. In this way, when the frequency signal CLK is at a high level, output of a next-stage frame signal STV(N+1) and output of a current-stage gate signal G(N) are at high levels, and the next-stage frame signal STV(N+1) is also used as a start signal of a next stage of the shift register circuit. The current-stage gate signal G(N) not only switches on an active switch (TFT) connected to a gate line in a current $N^{th}$ row of the display panel, but also is used as a control signal of the next stage of the shift register circuit. When output of a next-stage gate signal G(N+1) is also at a high level, a fifth switch T50 and a fourth switch T40 are synchronously switched on, so that output of the current-stage gate signal G(N) is at a low default potential VSS, so as to switch off the active switch in the current $N^{th}$ row in the display panel. In this way, while an active switch in a next row is switched on, an active switch in a current row is switched off. In this way, transferring is performed successively, so that active switches connected to all gate lines are sequentially switched on.

Figure 1C:
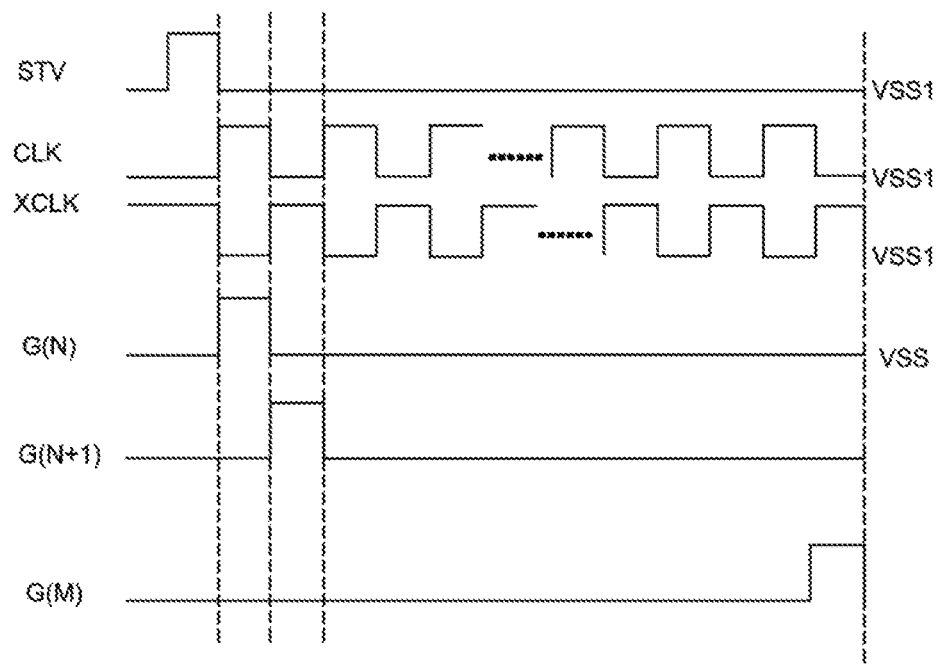
FIG. 1c is a schematic waveform diagram of an exemplary gate driver circuit substrate.

FIG. 1c is a schematic waveform diagram of an exemplary gate driver circuit substrate, and is a schematic waveform diagram of the circuit shown in FIG. 1b. Referring to FIG. 1c, a frequency signal CLK and a next-stage frequency signal XCLK are signals having opposite polarities and respectively control charging of active switches (TFFs) connected to gate lines in odd-numbered rows and gate lines in even-numbered rows.

To switch off the third switch T30 preferably, the frequency signal CLK and the next-stage frequency signal XCLK have a low adjustment potential VSS1. Because a voltage level of the low adjustment potential VSS1 is lower than a voltage level of the low default potential VSS, a low level signal obtained by a frame signal STV is also at the low adjustment potential VSS1, and the third switch T30 can be switched off preferably.

After the current-stage gate signal G(N) completes charging, the current-stage gate signal G(N) and the first node P1 are maintained at the low default potential VSS, that is, a control end T13 (G electrode) and a second end T12 (S electrode) of the first switch T10 are at the low default potential. When the frequency signal CLK is at a high potential, the first switch T10 can certainly be switched off. However, when the frequency signal CLK is at the low adjustment potential VSS1, because a voltage level of the low adjustment potential VSS1 is lower than a voltage level of the low default potential VSS, the first switch T10 is switched on, and a cross-voltage difference between a first end T11 (D electrode) and the second end T12 (S electrode) of the first switch T10 remains a voltage difference (VSS–VSS1) between the low default potential VSS and the low adjustment potential VSS1, leading to relatively high power consumption of the first switch T10. In addition, for charging a display panel, within the time of a frame, a row is only switched on once and is off in most of the remaining time. Consequently, power consumption of the first switch T10 remains high.

Figure 2A:
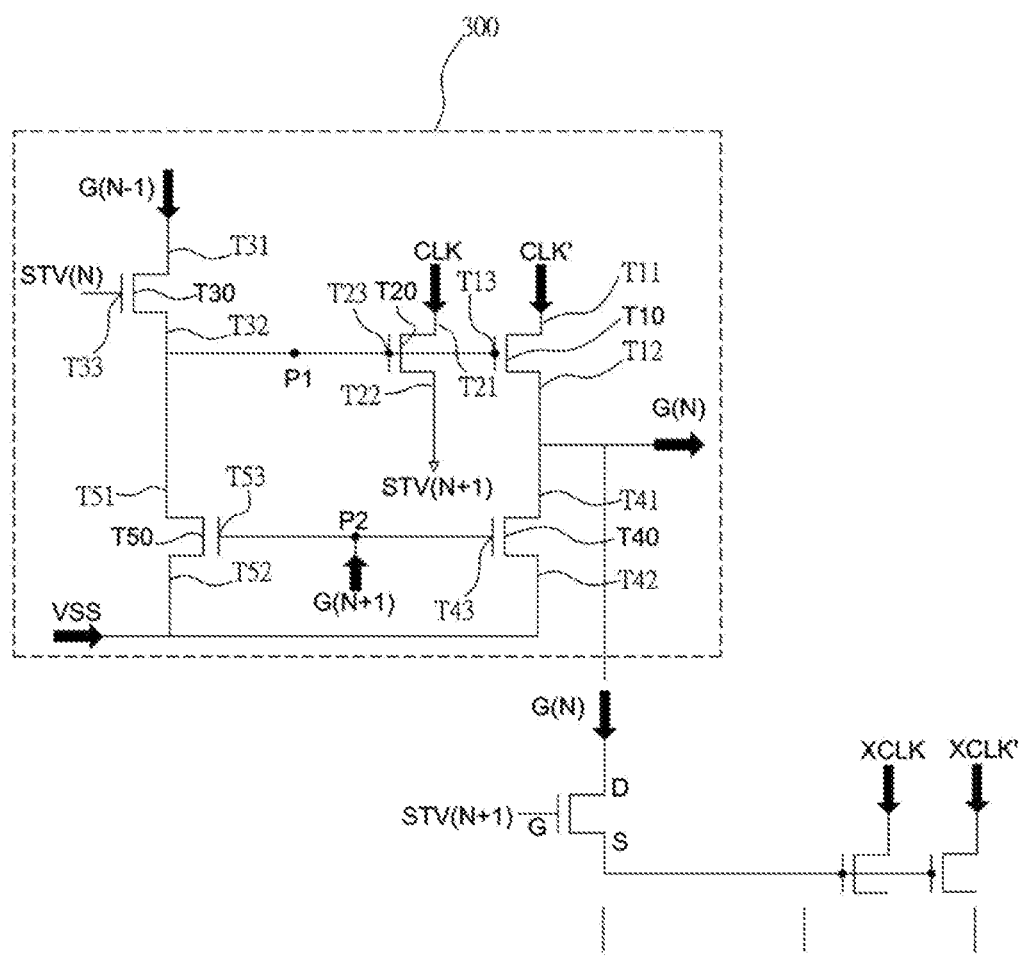
FIG. 2a is a schematic diagram of a shift register circuit in an embodiment of a method according to this application.

FIG. 2a is a schematic diagram of a shift register circuit in an embodiment of a method according to this application. Referring to FIG. 2a, a shift register circuit 300 includes a plurality of stages of shift registers. A shift register of each stage is expressed by using a dashed-line box and includes: a first switch T10, where a control end T13 of the first switch T10 is electrically coupled to a first node P1, a first end T11 of the first switch T10 is electrically coupled to a first frequency signal CLK', and a second end T12 of the first switch T10 is electrically coupled to a current-stage gate signal G(N); a second switch T20, where a control end T23 of the second switch T20 is electrically coupled to the first node P1, a first end T21 of the second switch T20 is electrically coupled to a second frequency signal CLK, and a second end T22 of the second switch T20 is electrically coupled to a next-stage frame signal STV(N+1); and a third switch T30, where a control end T33 of the third switch T30 is electrically coupled to a current-stage frame signal STV(N), and a second end T32 of the third switch T30 is electrically coupled to the first node P1.

In some embodiments, the shift register circuit 300 further includes a fourth switch T40, where a control end T43 of the fourth switch T40 is electrically coupled to a second node P2, a first end T41 of the fourth switch T40 is electrically coupled to the current-stage gate signal G(N), and a second end T42 of the fourth switch T40 is electrically coupled to a preset low potential VSS.

In some embodiments, the shift register circuit 300 further includes a fifth switch T50, where a control end T53 of the fifth switch T50 is electrically coupled to a second node P2, a first end T51 of the fifth switch T50 is electrically coupled to the first node P1, and a second end T52 of the fifth switch T50 is electrically coupled to a preset low potential VSS.

In some embodiments, the second node P2 is electrically coupled to a next-stage gate signal G(N+1).

In some embodiments, a first end T31 of the third switch T30 is electrically coupled to a preceding-stage gate signal G(N−1).

Figure 2B:
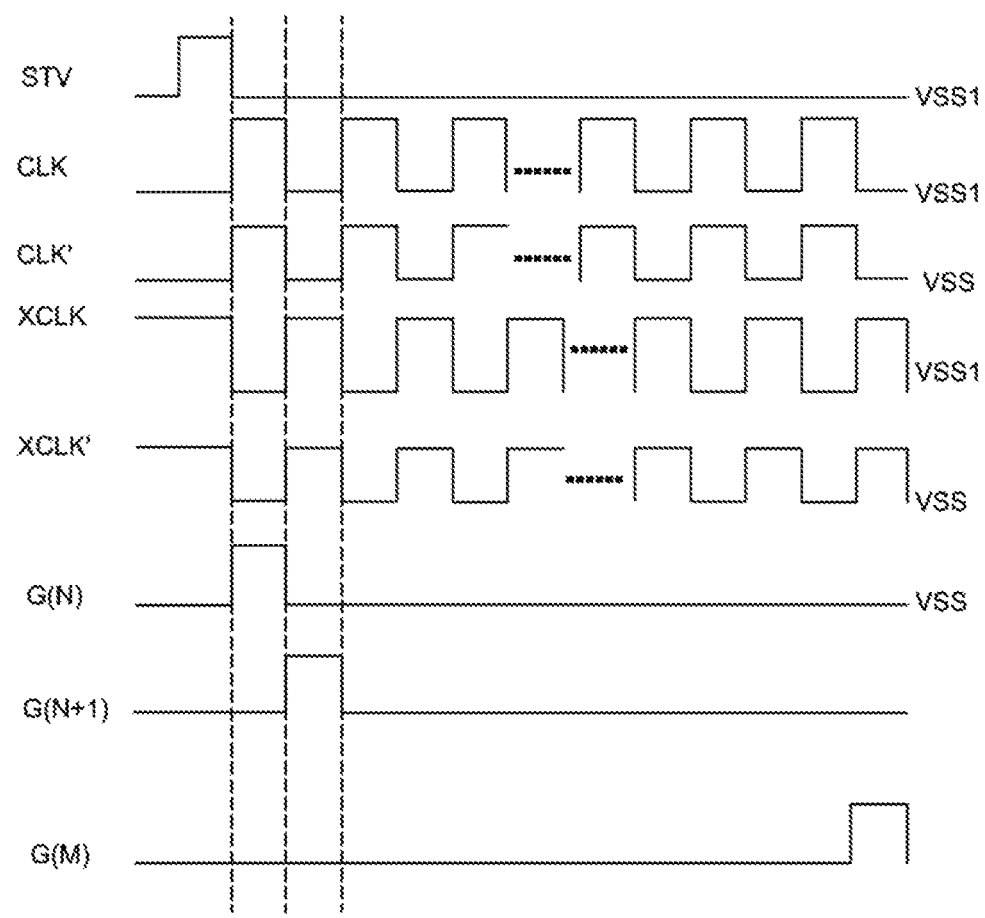
FIG. 2b is a schematic waveform diagram of a shift register circuit in an embodiment of a method according to this application.

FIG. 2b is a schematic waveform diagram of a shift register circuit in an embodiment of a method according to this application, and is a schematic waveform diagram of the circuit shown in FIG. 2a. Referring to FIG. 2a and FIG. 2b, a frequency signal circuit is divided into two frequency signal ends. A second frequency signal CLK is responsible for generating a current-stage frame signal, and a first the frequency signal CLK' is responsible for generating a current-stage gate signal G(N). A low level of the second frequency signal is a low adjustment potential VSS1, and a low level of the first the frequency signal CLK' is a low default potential VSS. When a gate line in an $N^{th}$ row performs charging normally, the first switch T10 and the second switch T20 are switched on as usual. In this case, a next-stage frame signal STV(N+1) and a current-stage gate signal G(N) are both at high levels. After the gate line in the $N^{th}$ row completes charging, the current-stage gate signal G(N) is at the low default potential VSS, and the next-stage frame signal STV(N+1) is at the VSS1. It can be learned that output of the frame signal STV and the gate signal are independently controlled, and even if the second the frequency signal CLK and the first the frequency signal CLK' are successive square wave signals, no cross-voltage difference is generated between a first end T11 and a second end T12 of the first switch T10 or between a first end T21 and a second end T22 of the second switch T20, that is, between D electrodes and S electrodes of the two switches, thereby preventing the first switch T10 and the second switch T20 from generating extra power consumption.

Figure 3:
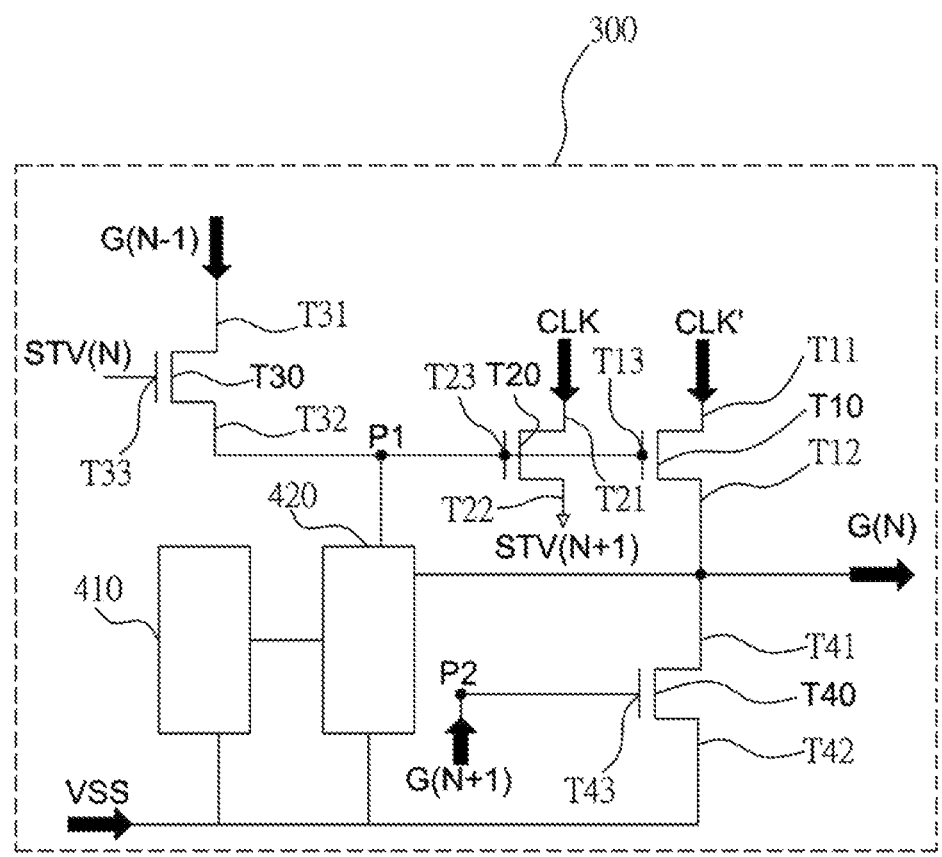
FIG. 3 is a schematic diagram of a shift register circuit in an embodiment of a method according to this application.

FIG. 3 is a schematic diagram of a shift register circuit in an embodiment of a method according to this application. Referring to FIG. 3, in some embodiments, the shift register circuit 300 further includes a pull-down sub-circuit 420, electrically coupled to the first node P1, the current-stage gate signal G(N), and a low default potential VSS.

In some embodiments, the shift register circuit 300 further includes a pull-down sub-circuit controller 410, electrically coupled to the low default potential VSS and the pull-down sub-circuit 420.

Figure 4:
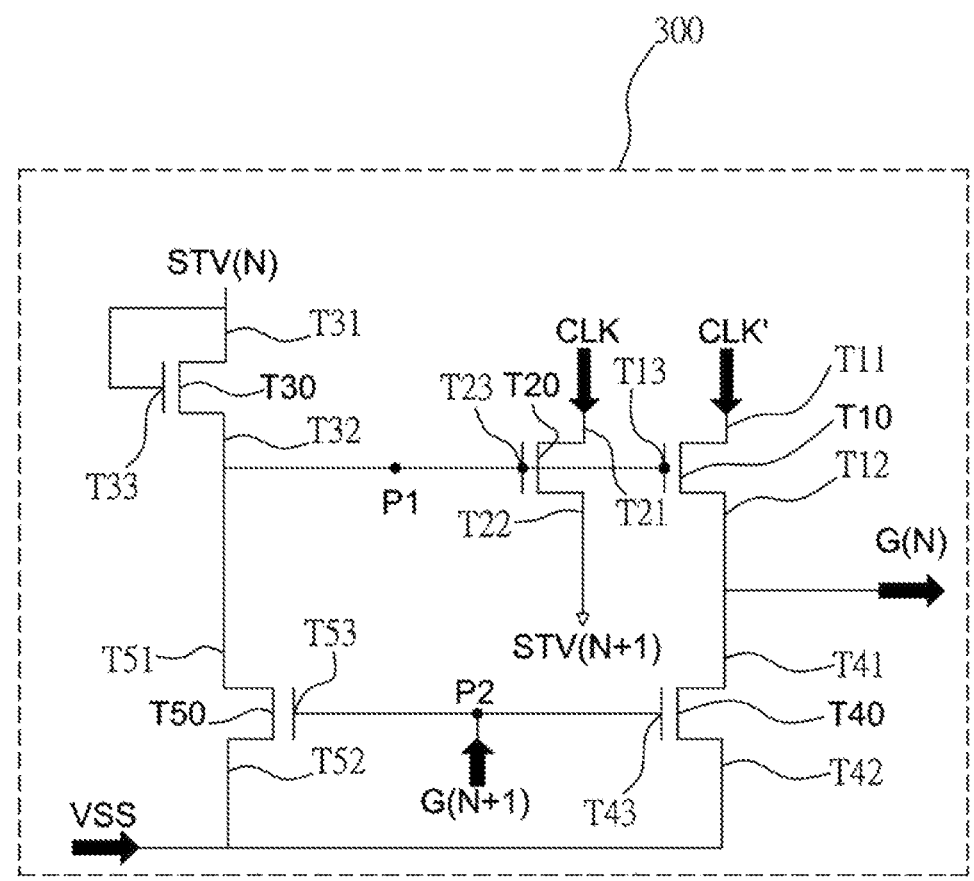
FIG. 4 is a schematic diagram of a shift register circuit in an embodiment of a method according to this application.

FIG. 4 is a schematic diagram of a shift register circuit in an embodiment of a method according to this application. Referring to FIG. 4, in some embodiments, a first end T31 of the third switch T30 is electrically coupled to a current-stage frame signal STV(N).

Figure 5:
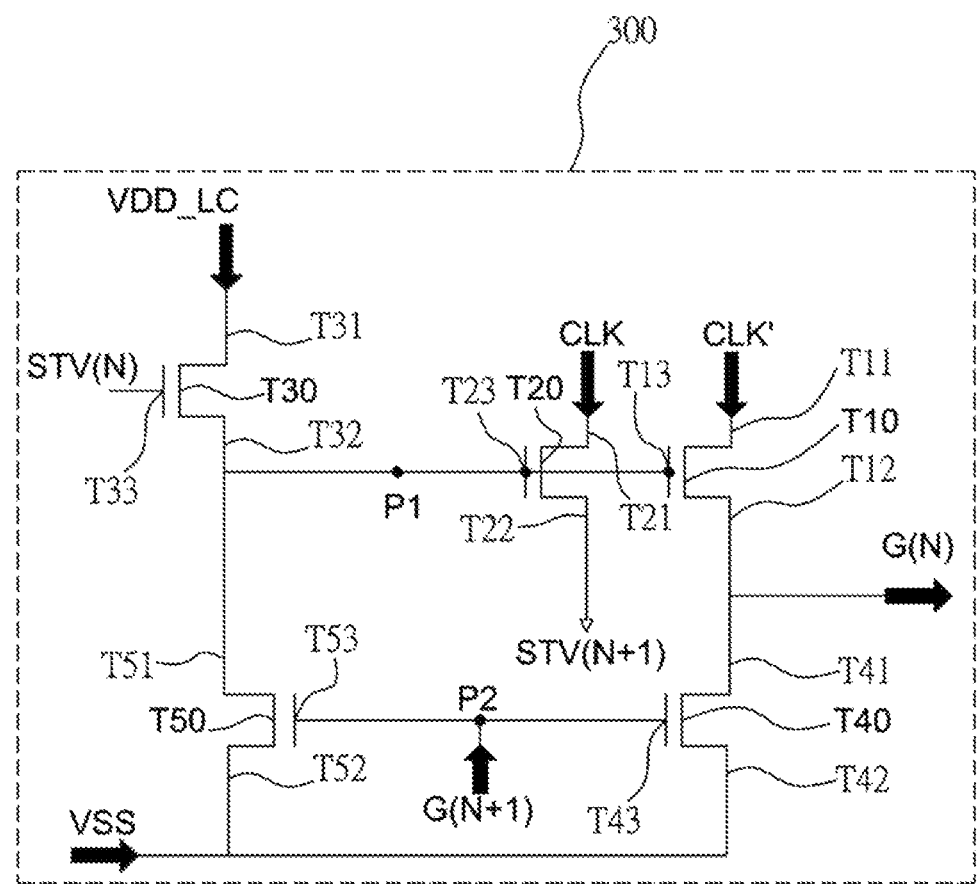
FIG. 5 is a schematic diagram of a shift register circuit in an embodiment of a method according to this application.

FIG. 5 is a schematic diagram of a shift register circuit in an embodiment of a method according to this application. Referring to FIG. 5, in some embodiments, a first end T31 of the third switch T30 is electrically coupled to a direct-current signal VDD_LC, to provide a power source for pre-charging the shift register circuit. The direct-current signal is used for pulling up a potential of the control end T33 of the third switch T30.

In an embodiment of this application, a display panel includes: a first substrate and a second substrate disposed opposite to each other; a liquid crystal layer disposed between the first substrate and the second substrate; a first polarizer, disposed on an outer surface of the first substrate; a second polarizer, disposed on an outer surface of the second substrate, where a polarization direction of the first polarizer is parallel to a polarization direction of the second polarizer, and a shift register circuit having the technical features of any foregoing embodiment.

In this application, original process requirements and product costs may be maintained without greatly changing an existing production procedure. When a frequency signal is switched to a low potential, an active switch connected to the frequency signal can no longer generate a cross-voltage difference, thereby preventing the active switch from generating extra power consumption because of an electric leakage, being switched on, or the like. The improvement can be easily implemented and also helps improve circuit reliability. This application is applicable to manufacturing of panels with various sizes and has relatively high applicability.

The wordings such as "in some embodiments" and "in various embodiments" are repeatedly used. The wordings usually refer to different embodiments, but they may also refer to a same embodiment. The words, such as "comprise", "have", and "include", are synonyms, unless other meanings are indicated in the context thereof.

The foregoing descriptions are merely specific embodiments of this application, and are not intended to limit this application in any form. Although this application has been disclosed above through the specific embodiments, the embodiments are not intended to limit this application. Any person skilled in the art can make some variations or modifications, namely, equivalent changes, according to the foregoing disclosed technical content to obtain equivalent embodiments without departing from the scope of the technical solutions of this application. Any simple amendment, equivalent change, or modification made to the foregoing embodiments according to the technical essence of this application without departing from the content of the technical solutions of this application shall fall within the scope of the technical solutions of this application.

What is claimed is:

1. A display panel, comprising:
   a first substrate;
   a second substrate, disposed opposite to the first substrate;
   a first polarizer, disposed on an outer surface of the first substrate;
   a second polarizer, disposed on an outer surface of the second substrate, wherein a polarization direction of the first polarizer is parallel to a polarization direction of the second polarizer; and
   a shift register circuit, disposed on the first substrate or the second substrate and comprising a plurality of stages of shift registers, wherein each shift register comprises:
   a first switch, wherein a control end of the first switch is electrically coupled to a first node, a first end of the first switch is electrically coupled to a first frequency signal, and a second end of the first switch is electrically coupled to a current-stage gate signal;
   a second switch, wherein a control end of the second switch is electrically coupled to the first node, a first end of the second switch is electrically coupled to a second frequency signal, and a second end of the second switch is electrically coupled to a next-stage frame signal; and
   a third switch, wherein a control end of the third switch is electrically coupled to a current-stage frame signal, and a second end of the third switch is electrically coupled to the first node.

2. The display panel according to claim 1, further comprising a fourth switch, wherein a control end of the fourth switch is electrically coupled to a second node, a first end of the fourth switch is electrically coupled to the current-stage gate signal, and a second end of the fourth switch is electrically coupled to a preset low potential, wherein the second node is electrically coupled to a next-stage gate signal.

3. The display panel according to claim 1, further comprising a fifth switch, wherein a control end of the fifth switch is electrically coupled to a second node, a first end of the fifth switch is electrically coupled to the first node, and a second end of the fifth switch is electrically coupled to a preset low potential, wherein the second node is electrically coupled to a next-stage gate signal.

4. The display panel according to claim 1, further comprising a pull-down sub-circuit, electrically coupled to the first node, the current-stage gate signal, and a low default potential.

5. The display panel according to claim 4, further comprising a pull-down sub-circuit controller, electrically coupled to the low default potential and the pull-down sub-circuit.

6. The display panel according to claim 1, wherein a first end of the third switch is electrically coupled to a preceding-stage gate signal.

7. The display panel according to claim 1, wherein a first end of the third switch is electrically coupled to the current-stage frame signal.

8. The display panel according to claim 1, wherein a first end of the third switch is electrically coupled to a direct-current signal.

9. The display panel according to claim 8, wherein the direct-current signal is used for pulling up a potential of the control end of the third switch.

10. A shift register circuit, comprising a plurality of stages of shift registers, wherein each shift register comprises:

a first switch, wherein a control end of the first switch is electrically coupled to a first node, a first end of the first switch is electrically coupled to a first frequency signal, and a second end of the first switch is electrically coupled to a current-stage gate signal;

a second switch, wherein a control end of the second switch is electrically coupled to the first node, a first end of the second switch is electrically coupled to a second frequency signal, and a second end of the second switch is electrically coupled to a next-stage frame signal;

a third switch, wherein a control end of the third switch is electrically coupled to a current-stage frame signal, and a second end of the third switch is electrically coupled to the first node;

a fourth switch, wherein a control end of the fourth switch is electrically coupled to a second node, a first end of the fourth switch is electrically coupled to the current-stage gate signal, and a second end of the fourth switch is electrically coupled to a preset low potential, wherein the second node is electrically coupled to a next-stage gate signal;

a fifth switch, wherein a control end of the fifth switch is electrically coupled to the second node, a first end of the fifth switch is electrically coupled to the first node, and a second end of the fifth switch is electrically coupled to the preset low potential; and a pull-down sub-circuit, electrically coupled to the first node, the current-stage gate signal, and a low default potential, wherein a first end of the third switch is electrically coupled to a preceding-stage gate signal, the current-stage frame signal, or a direct-current signal.

* * * * *